US011962324B1

(12) United States Patent
Hatami et al.

(10) Patent No.: US 11,962,324 B1
(45) Date of Patent: Apr. 16, 2024

(54) THRESHOLD-BASED MIN-SUM ALGORITHM TO LOWER THE ERROR FLOORS OF QUANTIZED LOW-DENSITY PARITY-CHECK DECODERS

(71) Applicants: Arrowhead Center, Inc., Las Cruces, NM (US); University of Notre Dame du Lac, South Bend, IN (US)

(72) Inventors: Homayoon Hatami, San Diego, CA (US); David G. Mitchell, Las Cruces, NM (US); Daniel Costello, Clarendon Hills, IL (US); Thomas Fuja, South Bend, IN (US)

(73) Assignees: Arrowhead Center, Inc., Las Cruces, NM (US); University of Notre Dame du Lac, South Bend, IN (US)

( * ) Notice: Subject to any disclaimer, the term of this patent is extended or adjusted under 35 U.S.C. 154(b) by 0 days.

(21) Appl. No.: 17/733,924

(22) Filed: Apr. 29, 2022

Related U.S. Application Data

(63) Continuation of application No. 16/871,917, filed on May 11, 2020, now abandoned.

(Continued)

(51) Int. Cl.
*H03M 13/11* (2006.01)

(52) U.S. Cl.
CPC ............................... *H03M 13/1125* (2013.01)

(58) Field of Classification Search
CPC ................................................ H03M 13/1125
See application file for complete search history.

(56) References Cited

U.S. PATENT DOCUMENTS 7,477,694 B2 1/2009 Sanderford et al.
8,266,493 B1 9/2012 Abbaszadeh et al.

(Continued)

FOREIGN PATENT DOCUMENTS

CN 104205647 A 12/2014
CN 109936379 A 6/2019

(Continued)

OTHER PUBLICATIONS

N. E. Maammar, S. Bri and J. Foshi, "Layered Offset Min-Sum Decoding for Low Density Parity Check Codes," 2018 International Symposium on Advanced Electrical and Communication Technologies (ISAECT), Rabat, Morocco, 2018, pp. 1-5.*

(Continued)

*Primary Examiner* — Steve N Nguyen
(74) *Attorney, Agent, or Firm* — Justin R. Jackson; Peacock Law P.C.

(57) ABSTRACT

A modified version of the min-sum algorithm ("MSA") which can lower the error floor performance of quantized LDPC decoders. A threshold attenuated min-sum algorithm ("TAMSA") and/or threshold offset min-sum algorithm ("TOMSA"), which selectively attenuates or offsets a check node log-likelihood ratio ("LLR") if the check node receives any variable node LLR with magnitude below a predetermined threshold, while allowing a check node LLR to reach the maximum quantizer level if all the variable node LLRs received by the check node have magnitude greater than the threshold. Embodiments of the present invention can provide desirable results even without knowledge of the location, type, or multiplicity of such objects and can be implemented with only a minor modification to existing decoder hardware.

17 Claims, 7 Drawing Sheets

A $A_{even}$ $A_{odd}$

Related U.S. Application Data

(60) Provisional application No. 62/873,061, filed on Jul. 11, 2019.

(56) References Cited

U.S. PATENT DOCUMENTS

| | | | | |
|---|---|---|---|---|
| 8,359,522 | B2 | 1/2013 | Gunnam et al. | |
| 8,549,375 | B2 | 10/2013 | Ueng et al. | |
| 8,621,318 | B1 | 12/2013 | Micheloni et al. | |
| 8,689,074 | B1 | 4/2014 | Tai | |
| 8,689,084 | B1 | 4/2014 | Tai | |
| 8,898,537 | B2 | 11/2014 | Gross et al. | |
| 8,935,598 | B1 * | 1/2015 | Norrie | H03M 13/112 714/755 |
| 8,984,376 | B1 | 3/2015 | Norrie | |
| 8,990,661 | B1 * | 3/2015 | Micheloni | H03M 13/114 714/758 |
| 9,100,153 | B2 | 8/2015 | Gross et al. | |
| 9,450,610 | B1 | 9/2016 | Micheloni et al. | |
| 9,590,656 | B2 | 3/2017 | Micheloni et al. | |
| 9,608,666 | B1 | 3/2017 | Morero et al. | |
| 9,813,080 | B1 | 11/2017 | Micheloni et al. | |
| 10,103,751 | B2 | 10/2018 | Morero et al. | |
| 10,230,396 | B1 | 3/2019 | Micheloni et al. | |
| 10,284,293 | B2 | 5/2019 | Bitra et al. | |
| 10,305,513 | B2 * | 5/2019 | Lee | H04L 1/20 |
| 10,374,632 | B2 | 8/2019 | Zhang et al. | |
| 10,778,248 | B1 | 9/2020 | Wu | |
| 11,309,915 | B1 | 4/2022 | Mitchell et al. | |
| 2005/0204271 | A1 * | 9/2005 | Sharon | H03M 13/3738 714/801 |
| 2005/0204272 | A1 * | 9/2005 | Yamagishi | H03M 13/1125 714/801 |
| 2007/0089019 | A1 | 4/2007 | Tang et al. | |
| 2009/0164540 | A1 * | 6/2009 | Oh | H03M 13/6362 708/207 |
| 2010/0131819 | A1 | 5/2010 | Graef | |
| 2010/0162075 | A1 | 6/2010 | Brannstrom et al. | |
| 2010/0306617 | A1 * | 12/2010 | Kondo | H03M 13/3738 714/752 |
| 2011/0231731 | A1 | 9/2011 | Gross et al. | |
| 2012/0221914 | A1 | 8/2012 | Morero et al. | |
| 2013/0019141 | A1 * | 1/2013 | Wang | H03M 13/1171 714/763 |
| 2013/0086445 | A1 | 4/2013 | Yedidia et al. | |
| 2014/0068394 | A1 | 3/2014 | Zhang et al. | |
| 2014/0108883 | A1 * | 4/2014 | Tehrani | H03M 13/1108 714/E11.031 |
| 2014/0201594 | A1 * | 7/2014 | Zhu | H03M 13/1137 714/758 |
| 2016/0134305 | A1 | 5/2016 | Morero et al. | |
| 2017/0085276 | A1 | 3/2017 | Prabhakar et al. | |
| 2017/0264316 | A1 * | 9/2017 | Lee | H03M 13/1128 |
| 2018/0041227 | A1 * | 2/2018 | Lee | H03M 13/2948 |
| 2020/0136653 | A1 * | 4/2020 | Kim | G06F 11/1012 |

FOREIGN PATENT DOCUMENTS

| | | | |
|---|---|---|---|
| EP | 2245772 | B1 | 4/2019 |
| JP | 6396977 | B2 | 9/2018 |
| TW | 201119247 | A | 6/2011 |
| WO | 2019013662 | A1 | 1/2019 |
| WO | 2019205313 | A1 | 10/2019 |

OTHER PUBLICATIONS

Eng Xu, Jianhui Wu and Meng Zhang, "A modified Offset Min-Sum decoding algorithm for LDPC codes," 2010 3rd International Conference on Computer Science and Information Technology, Chengdu, China, 2010, pp. 19-22.*

"Quasi-cyclic Low Density Parity-check code (QC-LDPC)", https://arxiv.org/ftp/arxiv/papers/1511/1511.00133.pdf, Downloaded Nov. 27, 2019.

Abdu-Aguye, Umar-Faruk , "On Lowering the Error-Floor of Short-to-Medium Block Length Irregular Low Density Parity-Check Codes", A thesis submitted to Plymouth University in partial fulfillment for the degree of Doctor of Philosophy, Oct. 2017.

All Answers Limited , "Adaptive FPGA-based LDPC-coded Manipulation", https://ukdiss.com/examples/adaptive-fpga-based-ldpc-coded-modulation.php, Nov. 2018.

Angarita, Fabian , et al., "Reduced-Complexity Min-Sum Algorithm for Decoding LDPC Codes with Low Error-Floor", IEEE Transactions on Circuits and Systems, vol. 61, No. 7, Jul. 2014, 2150-2158.

Chen, Jinghu , et al., "Reduced-Complexity Decoding of LDPC Codes", IEEE Transactions on Communications, vol. 53, No. 8, Aug. 2005, 1288-1299.

Darabiha, Ahmad , et al., "A Bit-Serial Approximate Min-Sum LDPC Decoder and FPGA Implementation", ISCAS 2006, IEEE, 2006, 149-152.

Fossorier, Marc P.C., et al., "Reduced Complexity Iterative Decoding of Low-Density Parity Check Codes Based on Belief Propagation", IEEE Transactions on Communications, vol. 47, No. 5, May 1999, 673-680.

Hailes, Peter , et al., "Hardware-Efficient Node Processing Unit Architectures for Flexible LDPC Decoder Implementations", IEEE Transactions on Circuits and Systems-II: Express Briefs, vol. 65, No. 12, Dec. 2018, 1919-1923.

Han, Yang , et al., "LDPC Decoder Strategies for Achieving Low Error Floors", Conference Paper, 2008 Information Theory and Applications Workshop, downloaded from IEEE Xplore, 2008.

He, Huanyu , et al., "A New Low-Resolution Min-Sum Decoder Based on Dynamic Clipping for LDPC Codes", Conference Paper, IEEE/CIC International Conference on Communications in China (ICCC), downloaded on Feb. 24, 2021 from IEEE Xplore, 2019, 636-640.

Howard, Sheryl , et al., "Soft-bit decoding of regular low-density parity-check codes", IEEE Transactions on Circuits and Systems II: Express Briefs, vol. 52, No. 10, Oct. 2005, 646-650.

Kudekar, Shrinivas , et al., "The effect of saturation on belief propagation decoding of LDPC codes", 2014 IEEE International Symposium on Information Theory, 2014, 2604-2608.

Lechner, Gottfried , "Efficient Decoding Techniques for LDPC Codes", https://publik.tuwien.ac.at/files/pub-et_12989.pdf, Jul. 2007.

Liu, Xingcheng , et al., "Variable-Node-Based Belief-Propagation Decoding With Message Pre-Processing for NANO Flash Memory", IEEE Access, vol. 7, 2019, 58638-58653.

Siegel, Paul H., "An Introduction to Low-Density Parity-Check Codes", http://cmrr-star.ucsd.edu/static/presentations/ldpc_tutorial.pdf, May 31, 2007.

Song, Suwen , et al., "A Reduced Complexity Decoding Algorithm for NB-LDPC Codes", Conference Paper, 17th IEEE International Conference on Communication Technology, downloaded Feb. 24, 2021 from IEEE Xplore, 2017, 127-131.

Tanner, R. Michael, et al., "LDPC Block and Convolutional Codes Based on Circulant Matrices", IEEE Transactions on Information Theory, VI. 50, No. 12, Dec. 2004, 2966-2984.

Tehrani, Seced Sharifi, "Stochastic Decoding of Low-Density Parity-Check Codes", Thesis submitted to McGill University in partial fulfillment of the requirements of the degree of Doctor of Philosophy, 2011.

Tehrani, S. , et al., "Stochastic decoding of low-density parity-check codes", Computer Science (abstract only), 2011.

Vasic, Bane , et al., "Failures and Error-Floors of Iterative Decoders", In Preparation for Channel, Coding Section of the Elsevier Science E-Book Serires, Dec. 2012.

Yu, Hui , et al., "Systematic construction, verification and implementation methodology for LDPC codes", EURASIP Journal on Wireless Communications and Networking, http://jwcn.eurasipjournals.com/content/2012/1/84, 2012.

Zhao, Jianguang , et al., "On Implementation of Min-Sum Algorithm and Its Modifications for Decoding Low-Density Parity-Check (LDPC) Codes", IEEE Transactions on Communications, vol. 53, No. 4, Apr. 2005, 549-554.

* cited by examiner

THRESHOLD-BASED MIN-SUM ALGORITHM TO LOWER THE ERROR FLOORS OF QUANTIZED LOW-DENSITY PARITY-CHECK DECODERS

CROSS-REFERENCE TO RELATED APPLICATIONS

This application is a continuation of U.S. patent application Ser. No. 16/871,917, filed on May 11, 2020, entitled "Threshold-Based Min-Sum Algorithm to Lower the Error Floors of Quantized Low-Density Parity-Check Decoders", which itself claims priority to and the benefit of the filing of U.S. Provisional Patent Application No. 62/873,061, entitled "Threshold-Based Min-Sum Algorithm to Lower the Error Floors of Quantized Low-Density Parity-Check Decoders", filed on Jul. 11, 2019, and the specification thereof is incorporated herein by reference.

STATEMENT REGARDING FEDERALLY SPONSORED RESEARCH OR DEVELOPMENT

This invention was made with government support from the National Science Foundation under grant numbers ECCS-1710920 and OIA-1757207. The government has certain rights in the invention.

BACKGROUND OF THE INVENTION

Embodiments of the present invention relate to a method and apparatus that selectively attenuates or offsets the messages in a Low-density parity-check (LDPC) decoder based on a simple threshold comparison.

LDPC codes are error-correcting codes that have been widely adopted in practice for reliable communication and storage of information, e.g., cellular data (5G), wi-fi, optical communication, space and satellite communication, magnetic recording, flash memories, and so on. Implementation of LDPC decoders involves iteratively passing quantized messages between processing units on the chip. To reduce implementation and usage costs (e.g., power, area, speed), an approximation to the usual algorithm, called the min-sum algorithm ("MSA"), is employed. Variants of min-sum are used in practice to adjust for the error in approximation and to improve error correction performance. These variants use an attenuation or offset (reduction) in the message values that are passed. Known implementations use a uniform attenuation or offset, meaning that the messages passed are all reduced in value in the same way—such known systems thus lack the ability to attenuate individual messages.

Currently, known systems and/or algorithms that can lower the error floor performance of a conventional state-of-the-art attenuated MSA ("AMSA") algorithm include:

Accepting errors and employing post-processing, which increases chip space, power consumption, and latency;

Requesting re-transmission ("HARQ")—requires feedback channel and adds latency, transmission power, and decoder power; and/or Increasing message precision (more bits for quantization)—increased hardware cost, memory requirements.

More specifically, LDPC codes are a class of linear block codes for which the performance of iterative message passing ("MP") decoding can approach that of much more complex maximum likelihood ("ML") decoding. The MSA is a simplified version of the sum-product algorithm ("SPA") that is commonly used for iterative MP decoding of LDPC codes, where the check node computation is approximated and hence is significantly easier to perform. This simplification is particularly desirable for hardware decoder implementations. Moreover, unlike the SPA, no estimation of the channel signal-to-noise ratio ("SNR") is needed at the receiver for an additive white Gaussian noise ("AWGN") channel.

Practical implementations of LDPC decoders require a finite precision (quantized) representation of the log-likelihood ratios. Quantized density evolution ("DE") has been used to find the optimum attenuation and offset parameters for the attenuated min-sum algorithm ("AMSA") and the offset min-sum algorithm ("OMSA"), in the sense that DE calculates the iterative decoding threshold, which characterizes the waterfall performance. Further improvements to the waterfall performance of the MSA for quantized and unquantized decoders have been made. At high SNRs, quantization typically causes the early onset of an error floor. It has been shown that certain objects, called trapping sets, elementary trapping sets, leafless elementary trapping sets, or absorbing sets in the Tanner graph, cause the iterative decoding process to get stuck, resulting in decoding errors at high SNRs. Hereafter, the sub-graphs induced by these sets, as well as similar sets, are referred to as problematic graphical objects. Several methods based on problematic objects have been proposed to estimate the performance of LDPC codes and a number of strategies have been proposed to lower the error floor of quantized LDPC decoders, including quantizer design, modifications to iterative decoding, and post-processing. Since each of these methods requires additional hardware and/or complexity, there is a present need for a system that can provide a simple solution, such as selective attenuation of message magnitudes, to avoid decoding failure.

BRIEF SUMMARY OF EMBODIMENTS OF THE PRESENT INVENTION

Embodiments of the present invention relate to a method for lowering the error floor of a quantized low-density parity-check decoder including comparing a variable node log-likelihood ratio magnitude with a threshold, based on the results of the comparison, determining whether to apply a reduction to the variable node log-likelihood ratio magnitude or not to apply a reduction to the variable node log-likelihood ratio magnitude, applying a reduction to the variable node log-likelihood ratio magnitude in instances when the determining step determines that a reduction should be applied, and not applying a reduction to the variable node log-likelihood ratio magnitude in instances when the determining step determines that a reduction should not be applied. Applying a reduction can include applying attenuation and/or offset. Applying attenuation can include multiplying the variable node log-likelihood ratio magnitude by a value that is greater than 0 and less than 1, and/or multiplying the variable node log-likelihood ratio magnitude by a value that is less than one and greater than or equal to 0.5. The method of claim 2 wherein applying attenuation comprises applying attenuation to the variable node log-likelihood ratio magnitude before the variable node log-likelihood ratio magnitude is passed from a check node to a variable node. Applying an offset can include applying a subtraction function, which itself can include subtraction of a predetermined number that is greater than zero and/or subtracting a value greater than zero before passing the variable node log-likelihood ratio to a variable node.

In one embodiment, comparing a magnitude of a variable node log-likelihood ratio with a threshold can include determining whether the variable node log-likelihood ratio is less than the threshold. Comparing a magnitude of a variable node log-likelihood ratio with a threshold can include determining whether the variable node log-likelihood ratio is less than or equal to the threshold, and/or comparing a magnitude of a variable node log-likelihood ratio with a predetermined value, which predetermined value can optionally have a magnitude of greater than 0 to a magnitude of 2.5. Comparing a variable node log-likelihood ratio magnitude with a threshold can include comparing a variable node log-likelihood ratio magnitude which comprises a minimum of a set of variable node log-likelihood ratio magnitudes with a threshold. The method can optionally include a second minimum of a set of variable node log-likelihood ratio magnitudes compared with a threshold. Applying a reduction to the variable node log-likelihood ratio magnitude can include applying a multiplication function of greater than zero and less than one and applying a subtraction function to the variable node log-likelihood ratio. Applying a reduction to the variable node log-likelihood ratio magnitude can also include varying a magnitude of the reduction by iteration and/or varying a magnitude of the reduction based on graph location $\tau(j)$ of check node index j.

In this application, we first show that the AMSA and OMSA exhibit worse (higher) error floors than the MSA with parameters that are optimized for waterfall performance. A modification is then introduced to the MSA that applies the strategies from the AMSA and the OMSA selectively, i.e., it applies attenuation/offset when it would be helpful and does not apply it otherwise. Assuming that there exist problematic graphical objects that cause most of the decoding failures in the high SNR regime, it will also be shown that the new MSA modification causes these objects to become less prone to decoding failures. As a result, embodiments of the present invention match the waterfall performance of the AMSA and OMSA, while improving their error floor performance. No information about the location or structure of the problematic objects is required to utilize this approach. However, knowledge of the problematic object facilitates determination of the optimal algorithm parameters. Moreover, AMSA (respectively OMSA) can be viewed as a particular case of the new threshold attenuated min-sum algorithm ("TAMSA") and respectively the new threshold offset min-sum algorithm ("TOMSA") and, as such, the performance of TAMSA (respectively TOMSA) is at least as good as AMSA (respectively OMSA) with optimal parameter selection. The complexity of embodiments of the present invention can be quantified to show that, because it uses the information that is already generated inside the check node processing unit of the AMSA or OMSA, the new algorithm is only slightly more complex to implement than the known systems.

Due to the time-consuming process of simulating the high SNR performance of LDPC codes, a code-independent and problematic object-specific method is preferably used to guide/optimize parameter selection and to evaluate the impact of embodiments of the present invention on the performance of LDPC codes containing problematic objects at high SNRs. The results show that embodiments of the present invention improve (i.e. reduce) the error floor caused by specific problematic objects compared to the MSA, AMSA, or OMSA.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more embodiments of the invention and are not to be construed as limiting the invention. In the drawings.

DETAILED DESCRIPTION OF THE INVENTION

Figure 1:
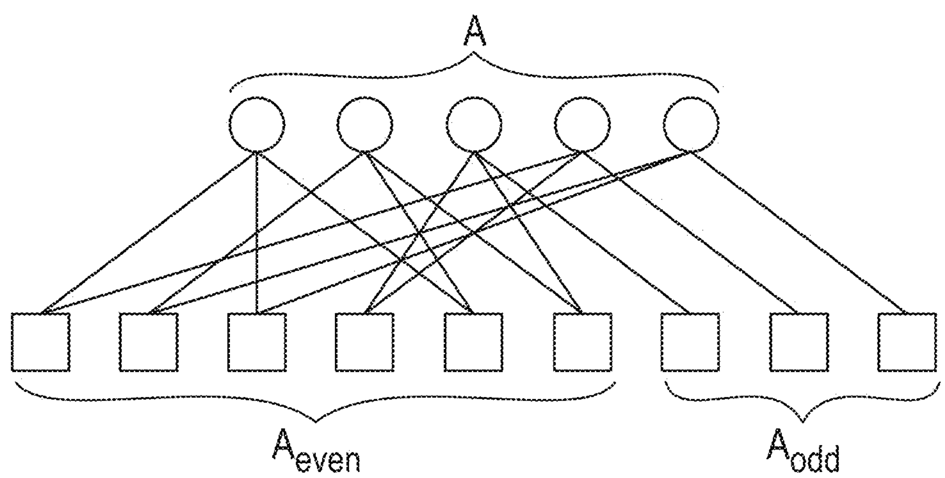
FIG. 1 is a drawing which illustrates the sub-graph G(A) induced by a (5,3) absorbing set A.

Embodiments of the present invention relate to decoding low-density parity-check ("LDPC") codes, wherein the attenuated min-sum algorithm ("AMSA") and the offset min-sum algorithm ("OMSA") can outperform the conventional min-sum algorithm ("MSA") at low signal-to-noise-ratios ("SNRs"), i.e., in the "waterfall region" of the bit error rate curve. For quantized decoders, MSA actually outperforms AMSA and OMSA in the "error floor" (high SNR) region, and all three algorithms suffer from a relatively high error floor. Embodiments of the present invention can include a modified MSA that can outperform MSA, AMSA, and OMSA across all SNRs. The implementation complexity of embodiments of the present invention are only slightly higher than that of the AMSA or OMSA. The simulated performance of embodiments of the present invention, using several classes of LDPC codes (including spatially coupled LDPC codes), is shown to outperform the MSA, AMSA, and OMSA across all SNRs.

Embodiments of the present invention relate to a novel modification to the check node update of quantized MSA that is straightforward to implement and reduces the error floor when compared to other known methods.

As background, let $V=\{v_1, v_2, \ldots, v_n\}$ and $C=\{c_1, c_2, \ldots, c_m\}$ represent the sets of variable nodes and check nodes, respectively, of a bipartite Tanner graph representation of an LDPC code with parity-check matrix H. Assume that a binary codeword $u=(u_1, u_2, \ldots, u_n)$ is binary phase shift keyed ("BPSK") modulated such that each zero is mapped to +1 and each one is mapped to −1. The modulated signal is transmitted over an AWGN channel with mean 0 and standard deviation $\sigma$. The received signal is $\tilde{r}=1-2u+n$, where n is the channel noise. The quantized version of $\tilde{r}$ is denoted as $r=(r_1, r_2, \ldots, r_n)$.

The Min-Sum Algorithm and its Modifications. The MSA is an iterative MP algorithm that is simpler to implement than the SPA. Unlike the SPA, the MSA does not require channel noise information to calculate the channel log-likelihood ratios ("LLRs"). The SPA is optimum for codes without cycles, but for finite length codes and finite precision LLRs, the SPA is not necessarily optimum, particularly with respect to error floor performance. Let $\mathbb{V}_{ij}$ represents the LLR passed from variable node $v_i$ to check node $c_j$ in a given iteration and let $\mathbb{C}_{ji}$ represent the LLR passed from $c_j$ to $v_i$. The check nodes that are neighbors to $v_i$ are denoted $N(v_i)$, and the variable nodes that are neighbors to $c_j$ are denoted $N(c_j)$. To initialize decoding, each variable node $v_i$ passes $r_i$ to the check nodes in $N(v_i)$, i.e., $$\mathbb{V}_{ij}=r_i, \quad \text{(Equation 1)}$$

where the $\mathbb{V}_{ij}$'s computed throughout the decoding process are referred to as the variable node LLRs. The check node operation to calculate the LLRs sent from check node $c_j$ to variable node $v_i$ is given by $$\mathbb{C}_{ji} = \left(\prod_{i' \in N(c_j)\backslash i} \text{sign}(\mathbb{V}_{i'j})\right) \cdot \min_{i' \in N(c_j)\backslash i} |\mathbb{V}_{i'j}|, \quad \text{(Equation 2)}$$

where the $\mathbb{C}_{ji}$'s computed throughout the decoding process are referred to as the check node LLRs. After each iteration, the hard decision estimate $\hat{u}$ is checked to see if it is a valid codeword, where $\hat{u}=0$ if and only if $$r_i + \sum_{j' \in N(v_i)} \mathbb{C}_{j'i} > 0. \quad \text{(Equation 3)}$$

If $\hat{u}$ is a valid codeword, or if the iteration number has reached $I_{max}$, decoding stops. Otherwise, the variable node LLRs are calculated as $$\mathbb{V}_{ij}=r_i+\Sigma_{j' \in N(v_i)\dagger j}\mathbb{C}_{j'i} \quad \text{(Equation 4)}$$

and decoding continues using equation 2. Two modified versions of the MSA, called attenuated (or normalized) MSA ("AMSA") and offset MSA ("OMSA"), were introduced to reduce the waterfall performance loss of the MSA compared to the SPA. The modified check node computations are given by $$\mathbb{C}_{ji} = \alpha\left(\prod_{i' \in N(c_j)\backslash i} sign(\mathbb{V}_{i'j})\right) \cdot \min_{i' \in N(c_j)\backslash i} |\mathbb{V}_{i'j}| \quad \text{(Equation 5)}$$

$$\mathbb{C}_{ji} = \left(\prod_{i' \in N(c_j)\backslash i} \text{sign}(\mathbb{V}_{i'j})\right) \cdot \max\left\{\min_{i' \in N(c_j)\backslash i} |\mathbb{V}_{i'j}| - \beta, 0\right\}, \quad \text{(Equation 6)}$$

respectively, where $\alpha, \beta>0$ are constants. In both algorithms, the check node LLR magnitudes are modified to be smaller than those of MSA. This reduces the negative effect of overestimating the LLR magnitudes in the MSA, whose larger check node LLR magnitudes compared to the SPA can cause additional errors in decoding at low SNRs.

Implementation of the MSA, AMSA, and OMSA. To implement the check node update of equation 2, in the check node processing unit corresponding to $c_j$, the sign and magnitude of $\mathbb{C}_{ji}$ to be sent to each $v_i$ are calculated separately as follows. First, for all $i' \in N(c_j)$ the signs of $\mathbb{V}_{i'j}$ are multiplied to form $\Pi_{i' \in N(c_j)} \text{sign}(\mathbb{V}_{i'j})$. Then, for each $i \in N(c_j)$, $\text{sign}(\mathbb{V}_{ij})$ is multiplied by $\Pi_{i' \in N(c_j)} \text{sign}(\mathbb{V}_{i'j})$ to form $\Pi_{i' \in N(c_j)\dagger i} \text{sign}(\mathbb{V}_{i'j})$. Second, the process of calculating $|\mathbb{C}_{ji}|$ involves finding two minimum values, the first and second minimum of all the $|\mathbb{V}_{i'j}|$ at check node $c_j$, denoted $\mathbb{M}_{1,j}$ and $\mathbb{M}_{2,j}$, respectively. For each $\mathbb{C}_{ji}$, if the variable node $v_i$ corresponds to $\mathbb{M}_{1,j}$, then $|\mathbb{C}_{ji}|=\mathbb{M}_{2,j}$, otherwise, $|\mathbb{C}_{ji}|=\mathbb{M}_{1,j}$. The implementation of equation 5 or 6 is the same with an extra step of attenuating or offsetting the minimum values.

The process of finding $\mathbb{M}_{1,j}$ and $\mathbb{M}_{2,j}$ is complex to implement. Therefore, several methods have been suggested to reduce the complexity of the process or to avoid calculating $\mathbb{M}_{2,j}$ and instead estimate it based on $\mathbb{M}_{1,j}$. The result is that $\mathbb{M}_{1,j}$ plays an important role in the check node processing unit, and embodiments of the present invention can also rely on $\mathbb{M}_{1,j}$, the extension of the algorithm to techniques designed for complexity reduction possible.

Quantized Decoders. In a uniform quantized decoder, the operations in equations 1-6 have finite precision, i.e., the values are quantized to a set of numbers ranging from $-l_{max}$ to $l_{max}$, with step size $\Delta$, where the resulting quantizer thresholds are set from $$-\ell_{max} + \frac{\Delta}{2} \text{ to } \ell_{max} - \frac{\Delta}{2}.$$

The attenuation and offset parameters α and β in equations 5 and 6 that have the best iterative decoding thresholds can be found by computer simulation or by using a technique called quantized density evolution.

Trapping Sets and Error Floors. Let A denote a subset of V of cardinality a. Let $A_{even}$ and $A_{odd}$ represent the subsets of check nodes connected to variable nodes in A with even and odd degrees, respectively, where $|A_{odd}|=b$. Here, A is referred to as an (a, b) trapping set. A is defined to be an (a, b) absorbing set if each variable node in A is connected to fewer check nodes in $A_{odd}$ than in $A_{even}$. These sets, along with similar objects such as elementary trapping sets and leafless elementary trapping sets, are known to cause most of the decoding errors at high SNRs in MP decoders. In FIG. 1, the sub-graph G(A) induced by a (5,3) absorbing set A is shown.

Figure 2:
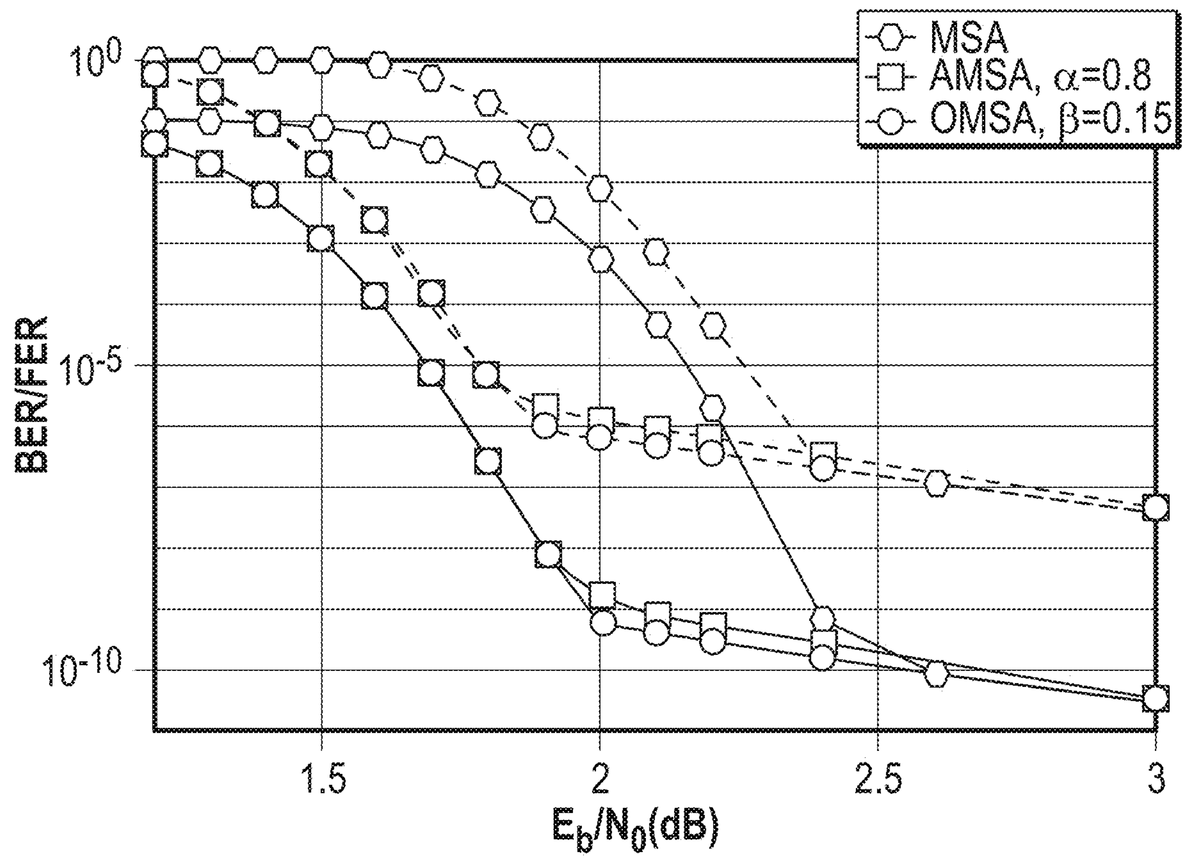
FIG. 2 is a graph which illustrates the simulated performance of an (8000,4000) LDPC code decoded with the MSA, AMSA, and OMSA, wherein solid curves represent bit-error-rate ("BER") and dashed curves represent frame-error-rate ("FER")

Threshold Attenuated/Offset MSA.—Motivation and Rationale. Although it is known that applying attenuation or offset when computing the check node LLRs typically improves performance in the low SNR (waterfall) region of the BER curve for quantized decoders, because high SNR performance is tied to problematic graphical objects, the AMSA and OMSA do not necessarily achieve a good error floor. For example, assuming BPSK modulation on the AWGN channel, FIG. 2 illustrates the simulated bit-error-rate ("BER") and frame-error-rate ("FER") performance of the (8000,4000) code, with a 5-bit uniform quantizer, Δ=0.15, and $l_{max}$=2.25, decoded using the MSA, AMSA, and OMSA. The performance of the quantized SPA using 6-bit quantization (1-bit sign, 2-bit integer, 3-bit fractional) is also illustrated for comparison. The AMSA and OMSA gain about 0.7 dB in the waterfall compared to the MSA. However, all the algorithms eventually exhibit an error floor at higher SNRs.

To improve the probability of correcting errors occurring in a problematic object G(A) at high SNR, we have found that it is helpful if the LLR magnitudes sent from a check node $c_j \in A_{even}$ to variable nodes $v_i \in A$ grow more slowly (i.e. are attenuated) when $c_j$ receives at least one unreliable (small magnitude) LLR from a variable node in A. This ensures that any incorrect LLRs received from the channel in A are not reinforced. On the other hand, if a check node $c_j$ (inside or outside G(A)) receives all large magnitude LLRs, these can be helpful for decoding and hence should not be attenuated. These two factors form the essence of the new threshold-based modification of AMSA/OMSA, presented below, that can lead to correct decoding of a received vector r that would not otherwise occur.

A Threshold Attenuated/Offset MSA. An embodiment of the present invention preferably makes use of a relationship observed at high SNRs between the variable node LLR magnitudes $|\mathbb{V}_{ij}|$ received by check node $c_j$ and the likelihood of the check node $c_j$ being inside a problematic object G(A). This relationship allows the problem of locating errors affected by G(A) to instead merely considering the variable node LLR magnitudes $|\mathbb{V}_{ij}|$ received at check node $c_j$, i.e., relying on the $|\mathbb{V}_{ij}|$'s to tell if $c_j$ is likely to be inside G(A) and has the potential to cause decoding failures. At high SNRs, the check node LLRs outside G(A) typically grow faster than the LLRs inside G(A). Therefore, if a check node $c_j$ receives at least one small LLR, i.e., $\min_{i' \in N(c_j)} |\mathbb{V}_{i'j}| \mathbb{V} | \mathbb{M}_{1,j}| \leq \tau$, where τ is a predetermined threshold, it is likely that $c_j$ is inside G(A). Consequently, to improve the error floor performance, the check node computation in equation 7 is preferably used to replace equation 2, where α'≤1 is an attenuation parameter designed to reduce the check node LLR magnitudes sent from a check node $c_j$ inside G(A) to the variable nodes in A. This modified check node update $$\mathbb{C}_{ji} = \begin{cases} \left(\prod_{i' \in N(c_j)\backslash i} \operatorname{sign}(\mathbb{V}_{i'j})\right) \cdot \min_{i' \in N(c_j)\backslash i} |\mathbb{V}_{i'j}|, & \text{if } \min_{i' \in N(c_j)\backslash i} |\mathbb{V}_{i'j}| > \tau, \\ \alpha' \left(\prod_{i' \in N(c_j)\backslash i} \operatorname{sign}(\mathbb{V}_{i'j})\right) \cdot \min_{i' \in N(c_j)\backslash i} |\mathbb{V}_{i'j}|, & \text{otherwise,} \end{cases} \quad \text{(Equation 7)}$$

$$\mathbb{C}_{ji} = \begin{cases} \left(\prod_{i' \in N(c_j)\backslash i} \operatorname{sign}(\mathbb{V}_{i'j})\right) \cdot \min_{i' \in N(c_j)\backslash i} |\mathbb{V}_{i'j}|, & \text{if } \min_{i' \in N(c_j)\backslash i} |V_{i'j}| > \tau, \\ \left(\prod_{i' \in N(c_j)\backslash i} \operatorname{sign}(V_{i'j})\right) \cdot \max\left\{\min_{i' \in N(c_j)\backslash i} |V_{i'j}| - \beta', 0\right\}, & \text{otherwise,} \end{cases} \quad \text{(Equation 8)}$$

At high SNRs, for a received vector r of channel LLRs, decoding is successful with high probability. In the case of unsuccessful decoding, it is known that a small number of problematic objects are likely to be the cause, i.e., objects containing variable nodes with unreliable (small magnitude) LLR values. In this regime, the channel LLRs for the variable nodes outside a problematic object will be, however, mostly reliable and have large magnitudes. In other words, the outside LLRs are typically initially large (with the correct sign) and will continue to grow quickly to even larger values (often $l_{max}$). However, even if some and/or all of the incorrect sign LLRs inside a problematic object are initially small, they can also be observed to grow quickly to larger values without correcting the errors in sign. This happens because the problematic object contains at least one short cycle, which prevents correction of the sign errors.

algorithm is referred to as the threshold attenuated MSA ("TAMSA"). As will be further shown, with a proper choice of the parameters τ and α', the TAMSA is capable of correctly decoding some of the errors that occur in the AMSA or MSA due to problematic objects.

In equation 7, α' is used to make the check node LLR magnitudes smaller when $\min_{i' \in N(c_j)} |\mathbb{V}_{i'j}| \leq \tau$. As an alternative (or in combination), an offset parameter β' can be used to serve the same purpose, as illustrated in equation 8, where β'>0 is an offset parameter that reduces the check node LLR magnitudes. This modified check node updated algorithm is denoted as the threshold offset MSA ("TOMSA"). Both the TAMSA and TOMSA selectively, or locally, reduce the magnitudes of the check node LLRs that are likely to belong to a problematic object without requiring knowledge of its location or structure. The TAMSA and TOMSA add a simple threshold test compared to the AMSA and OMSA, while the attenuation (offset) parameter only needs to be applied to a few check nodes at high SNRs.

In one embodiment, the threshold $\tau$ can optionally be varied by iteration number—for example, the value of $\tau$ used in equations 7 and 8 can be a function $\tau(I)$ of the iteration number $0 \le I \le I_{max}$. The threshold $\tau$ can also optionally be varied by graph location—for example as a function $\tau(j)$ of check node index j. Although embodiments of the present invention can provide desirable results without such variations, such variations can provide further performance improvements.

Implementation of Threshold Attenuated/Offset MSA. For the MSA, for some number K of inputs to a check node processing unit, the implementation of sub-units to calculate $\mathbb{M}_{1,j}$ and $\mathbb{M}_{2,j}$ and the index needed to identify which input created $\mathbb{M}_{1,j}$ required a significant number of multiplexers, comparators, and inverters, which is a function of K. A check node processing unit preferably includes some additional sub-units to generate the proper output and apply the attenuation (offset) parameter for the AMSA and/or OMSA. Implementation of the TAMSA and/or TOMSA adds just two simple steps to the implementation of the AMSA and/or OMSA. First, for a check node processing unit corresponding to $c_j$, after calculating $\mathbb{M}_{1,j}$ and $\mathbb{M}_{2,j}$, the value of $\mathbb{M}_{1,j}$ is preferably compared to $\tau$. Second, a decision is made based on the outcome of the comparison to use the attenuated (offset) or non-attenuated (non-offset) output. Consequently, implementation of the TAMSA and/or TOMSA requires just one extra comparator and K extra multiplexers to decide if attenuation (offset) should be applied. If not, the additional multiplication for attenuation (or subtraction for offset) is not necessary. Hence, the extra requirements do not significantly increase the overall area or delay of a check node processing unit.

To illustrate the robustness of an embodiment of the present invention, consider the (8000,4000) MacKay code, the progressive edge growth ("PEG") (1008,504) LDPC code, and the quasi-cyclic (155,64) Tanner code decoded with various algorithms, including the TAMSA and TOMSA according to an embodiment of the present invention, with different parameters, each using a 5-bit uniform quantizer with $\Delta=0.15$ and $l_{max}=2.25$.

Performance Estimation Based on Problematic Objects. The impact of a problematic object on the performance of an LDPC code decoded with the MSA, AMSA, and TAMSA can be estimated. To do so, a lower bound on the FER of any LDPC code containing a given problematic object (subgraph) is derived, assuming a particular message passing decoder and decoder quantization. A crucial aspect of the lower bound is that it is code-independent, in the sense that it can be derived based only on a problematic object and then applied to any code containing that object. Given the dominant problematic object, decoder quantization, and decoding algorithm, a performance estimate of the code containing the dominant object can be derived. The number, type, and location of problematic objects in the Tanner graph do not need to be known to implement the algorithm. However, if the dominant problematic object is known, the performance estimate can facilitate determination of the optimum algorithm parameters. The lower bounds are tight for a variety of codes, problematic objects, and decoding algorithms.

Figure 3A:
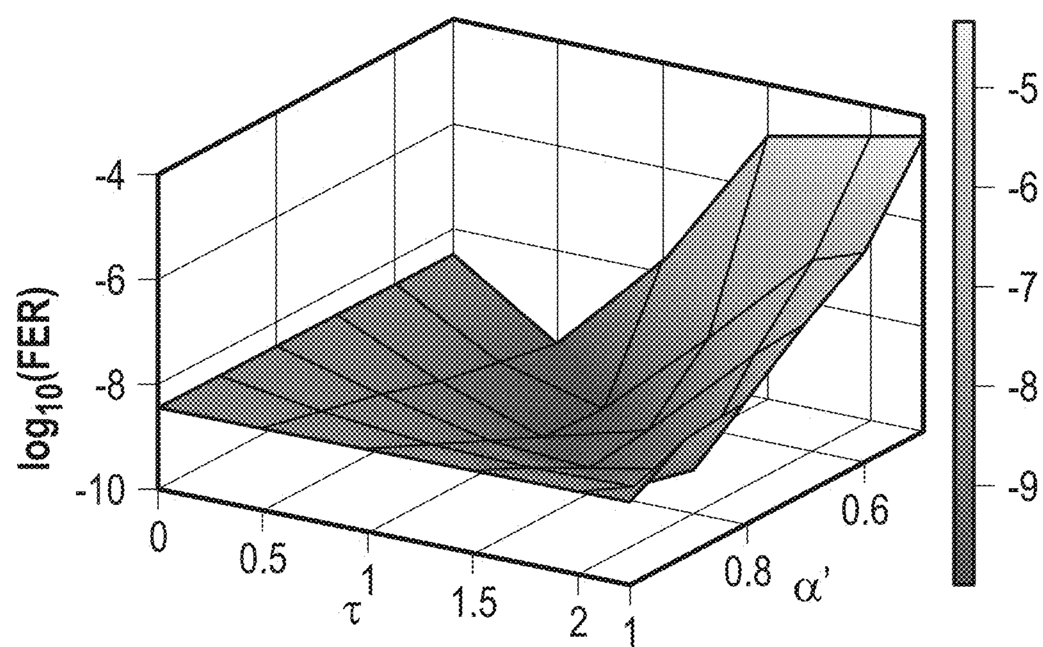
FIG. 3A is a graph which illustrates the estimated FER performance vs. the parameter sets ($\alpha'$, $\tau$) for $0.5 \leq \alpha' \leq 1$, $0 \leq \tau \leq l_{max}$, and $E_b/N_0$=2 dB.
Figure 3B:
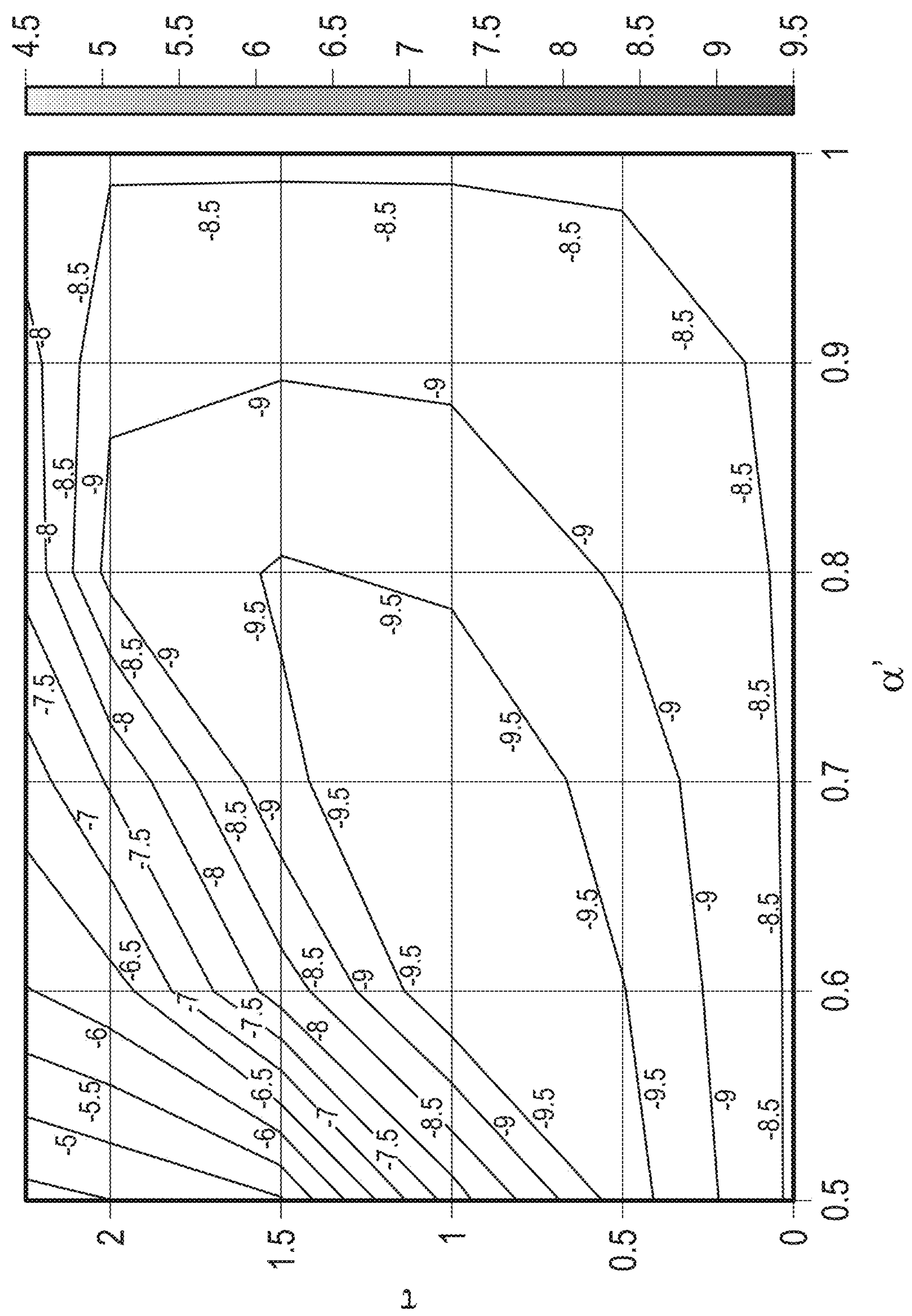
FIG. 3B is a graph which illustrates a contour plot of the estimated FER performance vs. the parameter sets ($\alpha'$, $\tau$) for $0.5 \leq \alpha' \leq 1$, $0 \leq \tau \leq l_{max}$, and $E_b/N_0$=2 dB.

By analyzing the AWGN channel performance simulations of the (8000,4000) code with a 5-bit quantizer, the (5,3) absorbing set of FIG. 1 is found to be the major cause of errors in the error floor. Based on this problematic object, high SNR performance estimates of the code (or any code containing this problematic object as the dominant object) can be obtained for various TAMSA parameter sets and for various values of $E_b/N_0$(dB). For example, FIG. 3A plots the estimated FER performance vs. the parameter sets ($\alpha'$, $\tau$) for $0.5 \le \alpha' \le 1$, $0 \le \tau \le l_{max}$, and $E_b/N_0=2$ dB. (A contour plot of the same data is illustrated in FIG. 3B.) Note that when $\tau=l_{max}$, the TAMSA is equivalent to the AMSA with $\alpha=\alpha'$, because attenuation is always applied. As illustrated in FIG. 3A, the line $\tau=l_{max}=2.25$ has a very high FER, meaning that any code containing this (5,3) absorbing set is adversely affected in the error floor when decoded using the AMSA. Also, in two special cases, ($\alpha'$, $\tau=0$) and ($\alpha'=1$, $\tau$), the TAMSA is equivalent to the MSA, because attenuation is never applied for these parameter sets. From FIG. 3A, it can be predicted that the MSA will perform better than the AMSA in the error floor for any code for which the (5,3) absorbing set is dominant. It is also important to note from FIG. 3A that there are values of $\alpha$ and $\tau$ that lead to better performance than can be achieved by either the AMSA or the MSA for any code for which the (5,3) absorbing set is dominant. This observation supports making use of the parameter t in the TAMSA to reduce the error probability associated with a specific problematic object compared to either the AMSA or the MSA.

Figure 4:
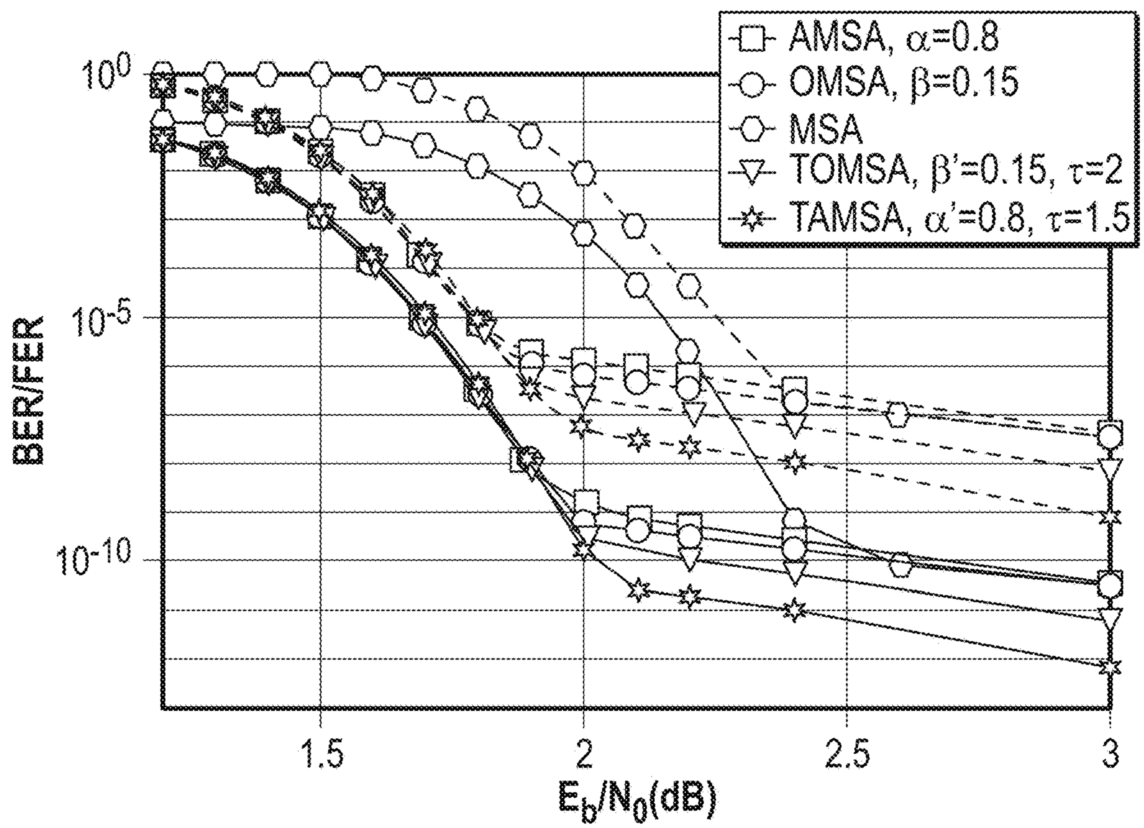
FIG. 4 is a graph which illustrates the simulated performance of an (8000,4000) LDPC code decoded with the MSA, AMSA, OMSA, TAMSA, and TOMSA, wherein solid curves represent BER and dashed curves represent FER.

Simulated Performance of LDPC Codes with TAMSA and TOMSA Decoders. FIG. 4 illustrates the BER and FER performance of the (8000,4000) code for the MSA, the AMSA with $\alpha=0.8$, the OMSA with $\beta=0.15$, the TAMSA with parameters ($\alpha'=0.8$, $\tau=1.5$), and the TOMSA with parameters ($\beta'=0.15$, $\tau=2$). A syndrome-check stopping rule with a maximum number of iterations $I_{max}=50$ was employed for all decoders. For the chosen parameters, the TAMSA and TOMSA exhibit one to two orders of magnitude better error floor performance than the MSA, AMSA, and OMSA while maintaining the same waterfall performance.

Figure 5:
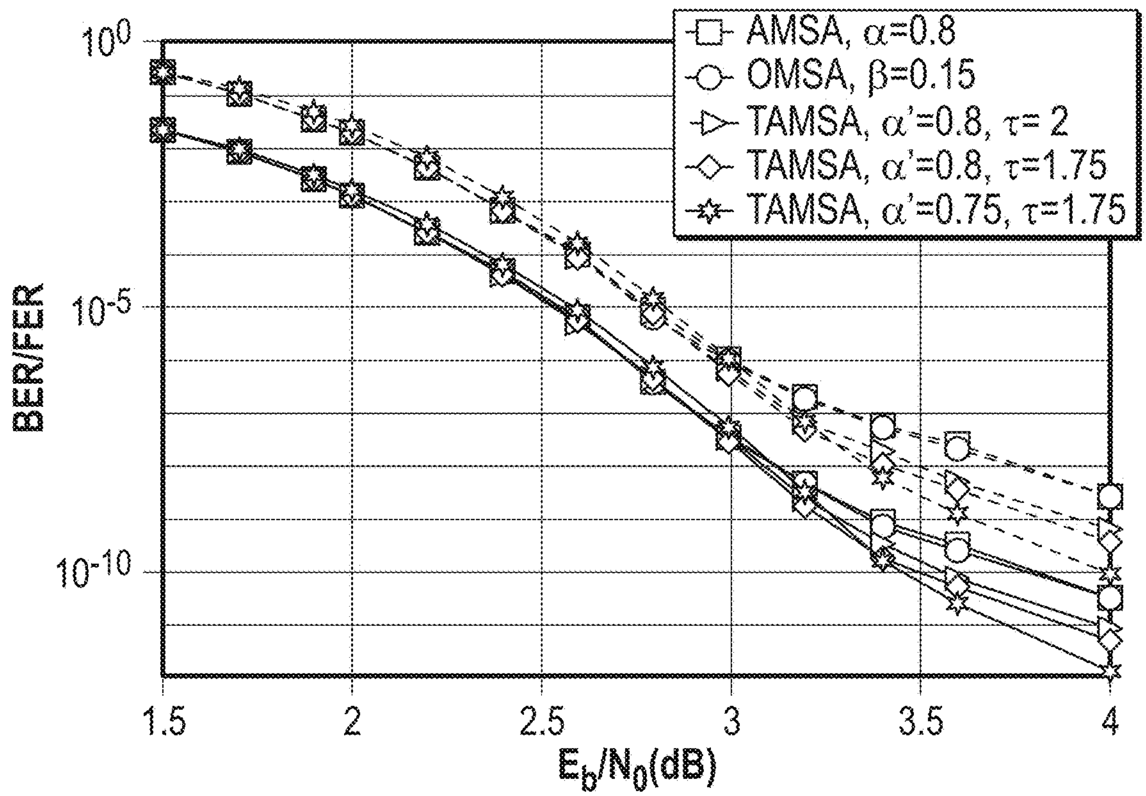
FIG. 5 is a graph which illustrates the simulated performance of an (1008,504) progressive-edge-growth LDPC ("PEG-LDPC") code decoded with the AMSA, OMSA, and TAMSA, wherein solid curves represent BER and dashed curves represent FER.

FIG. 5 illustrates the BER and FER performance of the (semi-structured) (1008,504) PEG-LDPC code for the AMSA, OMSA, and TAMSA with three parameter sets: ($\alpha'=0.8$, $\tau=2$), ($\alpha'=0.8$, $\tau=1.75$), and ($\alpha'=0.75$, $\tau=1.75$). Again, the best error floors are achieved with the TAMSA. The parameter set ($\alpha'=0.75$, $\tau=1.75$) exhibits the most gain, about 1.5 orders of magnitude compared to the AMSA and OMSA for $E_b/N_0=4$ dB, but its waterfall performance is slightly worse than for the parameter sets ($\alpha'=0.8$, $\tau=2$) and ($\alpha'=0.8$, $\tau=1.75$). This behavior allows the ability to tune the performance of the TAMSA to fit a particular application by choosing the values of $\alpha'$ and $\tau$.

Figure 6:
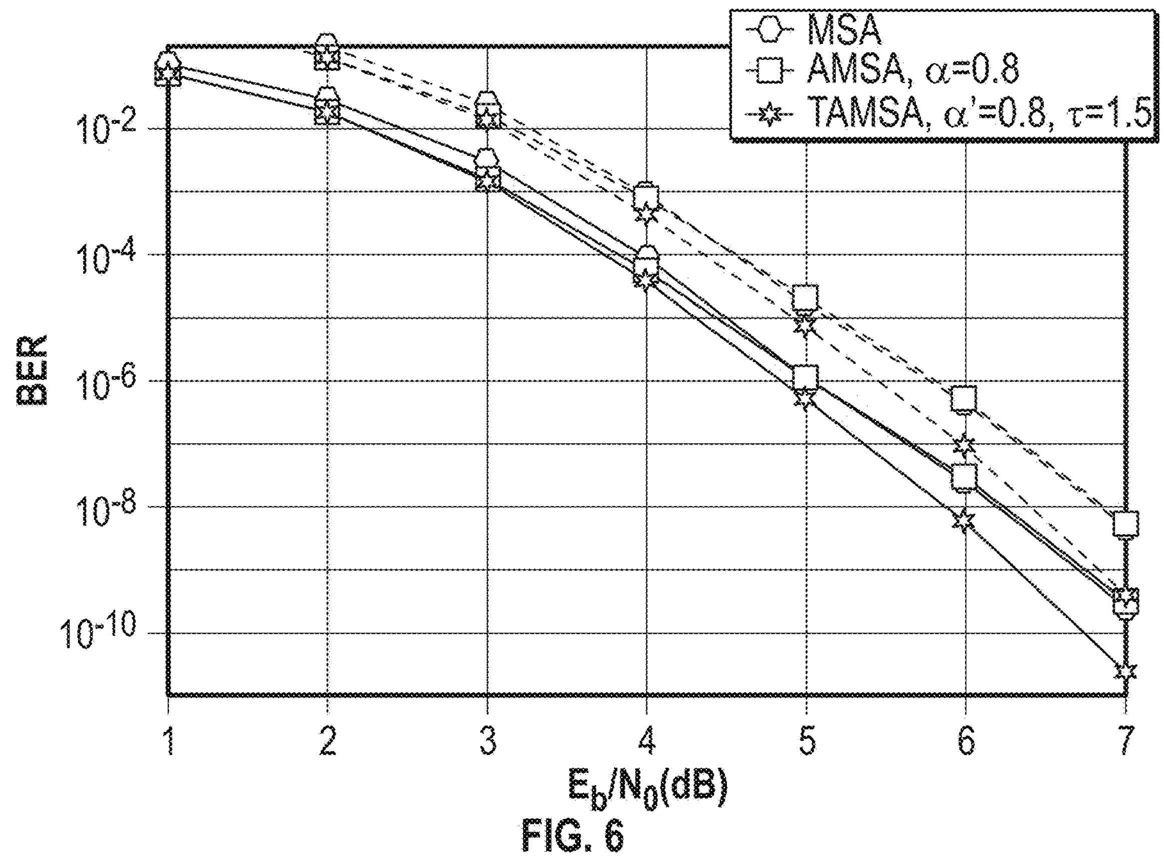
FIG. 6 is a graph which illustrates the simulated performance of a (155,64) Tanner LDPC code with the MSA, AMSA, and TAMSA, wherein solid curves represent BER and dashed curves represent FER.

FIG. 6 illustrates the BER performance of the (highly structured) quasi-cyclic (155,64) Tanner code for the AMSA with different values of $\alpha$, the TAMSA with parameter set ($\alpha'=0.8$, $\tau=1.5$), and the MSA. Again, it is observed that at high SNRs, the TAMSA significantly outperforms both the AMSA and the MSA, gaining about one order of magnitude in the error floor. An important performance metric for comparison of these algorithms is the average number of iterations performed. Table I gives the average number of iterations for the AMSA, MSA, and TAMSA recorded from 1 dB to 8 dB. We observe that the AMSA and TAMSA have an approximately equal number of average iterations. Moreover, both the AMSA and TAMSA provide a significant reduction in the average number of iterations when compared to the MSA at low SNR. This advantage diminishes as the SNR increases, and all of the algorithms have a similar average number of iterations at high SNR.

Table 1 illustrates average number of iterations recorded for the quasi-cyclic (155,64) Tanner code with the MSA, AMSA, and TAMSA decoding algorithms.

TABLE 1

| $E_b/N_0$ | MSA | AMSA | TAMSA |
|---|---|---|---|
| 1 dB | 68.95 | 59.28 | 59.24 |
| 2 dB | 30.4 | 23.13 | 22.9 |
| 3 dB | 7.82 | 6.28 | 6.2 |
| 4 dB | 3.06 | 2.95 | 2.87 |
| 5 dB | 1.97 | 1.98 | 1.98 |
| 6 dB | 1.44 | 1.46 | 1.46 |
| 7 dB | 1.09 | 1.1 | 1.1 |
| 8 dB | 0.85 | 0.86 | 0.86 |

Figure 7:
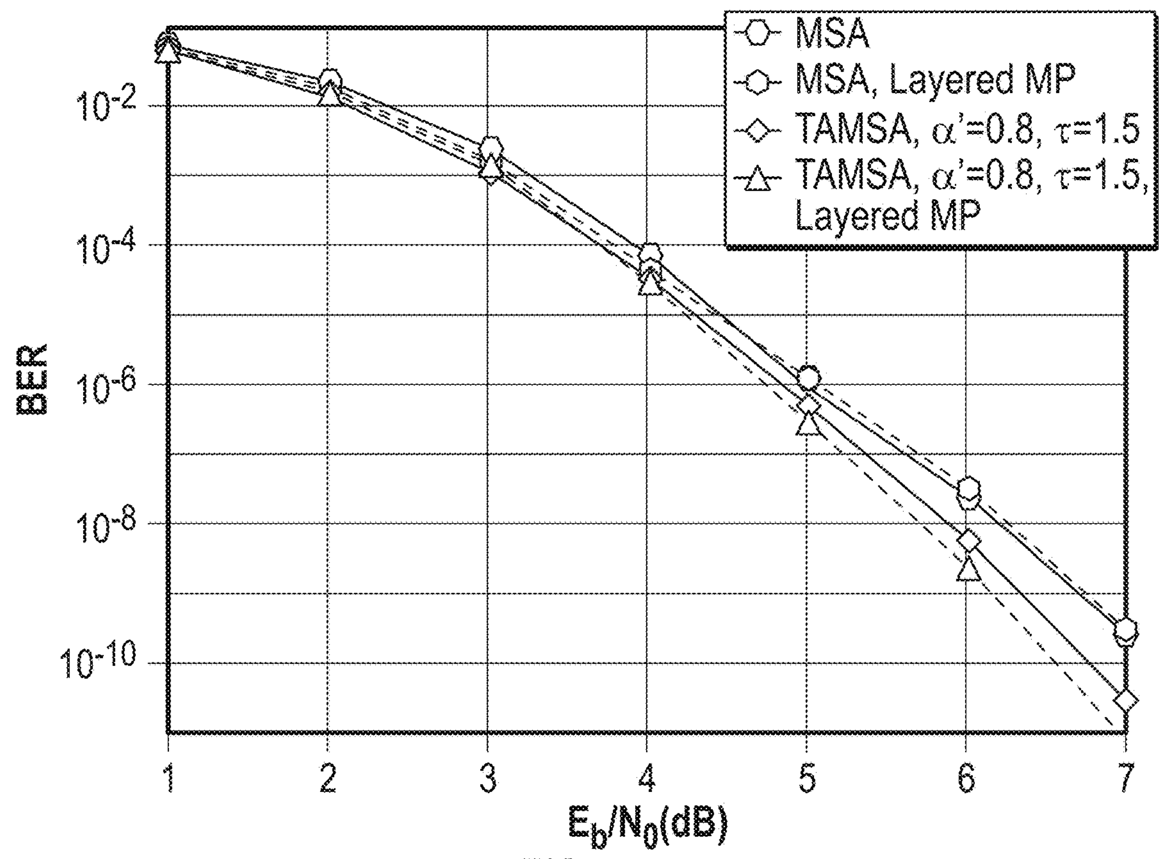
FIG. 7 is a graph which illustrates the simulated BER performance of the (155,64) Tanner LDPC code with the MSA and the TAMSA with both layered MP and standard MP decoding.

Layered MP decoding of LDPC-BCs converges faster than standard MP decoding and is commonly employed in the implementation of quasi-cyclic codes. FIG. 7 illustrates the BER performance of the quasi-cyclic (155,64) Tanner code, using both a layered MP decoder and a standard MP decoder with 100 iterations each, for both the MSA and the TAMSA with parameter set ($\alpha'=0.8$, $\tau=1.5$). The TAMSA, with both standard and layered decoding, outperforms the MSA and the layered TAMSA and is slightly better than the standard TAMSA in the error floor. Taken together, the results of FIGS. 4-7 illustrate the robustness of TAMSA decoding.

Parameter Set Selection for TAMSA and TOMSA Decoders. FIG. 5 illustrates that the TAMSA parameter sets that lead to the best error floor performance do not necessarily lead to the best waterfall performance. Depending on the application and design goals, the parameter sets can be chosen differently. For example, if $\alpha'=\alpha_{opt}$, where $\alpha_{opt}$ is the optimal a for the AMSA derived using quantized DE, the best waterfall performance can be achieved. However, choosing $\alpha'=\alpha_{opt}$ is best suited to larger values of $\tau$, because for $\tau=l_{max}$ the TAMSA and AMSA are the same, and there can be a loss in waterfall performance for smaller values of $\tau$.

In the error floor, instead of running time-consuming code simulations, a different method can be applied to problematic objects to find the parameter sets ($\alpha'$, $\tau$) that lead to the best error floor performance. From the contour plots in FIG. 3B of the FER performance of any code for which the (5,3) absorbing set is dominant in the error floor, it can be seen that certain parameter sets ($\alpha'$, $\tau$) lead to significantly lower FER values than others. These parameter sets can then be used to guide the selection of the parameters that yield the best error floor performance of any code for which the (5,3) absorbing set is dominant. According to FIG. 3B, the best error floor for a code containing the (5,3) absorbing set is achieved by choosing a parameter set in the vicinity of ($\alpha'=0.65$, $\tau=1$). If the goal is to achieve waterfall performance as good as the AMSA with $\alpha=\alpha_{opt}$ and to achieve a better error floor than the MSA or AMSA, a good starting point is to set $\alpha'=\alpha_{opt}$ and then choose the value of $\tau$ that leads to the best error floor estimate associated with the dominant problematic object. If there is more than one value of that satisfies this condition, the largest should be chosen, because larger values of $\tau$ makes the TAMSA perform closer to the AMSA optimized for waterfall performance. In FIG. 3B, $\alpha_{opt}=0.8$, and therefore choosing the parameter set ($\alpha'=0.8$, $\tau=1.5$) should provide good performance in both the waterfall and the error floor. The simulation results in FIG. 4 of the (8000,4000) LDPC-BC using this parameter set illustrates the advantage of following this approach.

In FIGS. 2, 4, and 5, it can be seen that the OMSA slightly outperforms the AMSA at high SNRs. This follows from the fact that, for the chosen values of $l_{max}$, $\alpha$, and $\beta$, the LLR magnitudes for the OMSA grow to larger values than for the AMSA (quantized value of $l_{max}-\beta=2.10$ vs. quantized value of $\alpha\times l_{max}=1.8$). Adopting the terminology that check node LLRs larger than $\tau$ are reliable while those below $\tau$ are unreliable, the reliable check node LLRs of the OMSA (with magnitudes up to 2.10) are more likely to "correct" additional errors inside a problematic object G(A) than those of the AMSA (with magnitudes only up to 1.8). However, in FIG. 4, it can be seen that the TAMSA has better error floor performance than the TOMSA. While the check node LLRs that satisfy equation 7 or 8 (i.e., the reliable LLRs), for both the TAMSA and the TOMSA can grow to $l_{max}$, the check node LLRs that don't satisfy equation 7 or 8 (i.e., the unreliable LLRs), are limited to values smaller than $\tau$ (a quantized value of $\alpha'\times\tau=1.2$ for the TAMSA vs. a quantized value of $\tau-\beta'=1.85$ for the TOMSA). Consequently, for the parameter sets chosen for the examples contained herein, the TAMSA makes the unreliable check node LLRs smaller than for the TOMSA, which helps TAMSA "correct" more errors by slowing down the check node LLR convergence inside a problematic object.

As previously discussed, AMSA and/or OMSA can be viewed as a particular case of TAMSA and/or TOMSA and, as such, the performance of TAMSA and/or TOMSA is at least as good as AMSA and/or TOMSA with optimal parameter selection. Moreover, significant performance improvements can be seen for a variety of code structures and lengths.

Application of the TAMSA to Spatially Coupled LDPC Codes. Spatially Coupled LDPC Codes ("SC-LDPCC") are known to combine the best features of both regular and irregular LDPC-BCs, i.e., they achieve excellent performance both in the waterfall and the error floor regions of the BER (FER) curve. The TAMSA is preferably used to decode SC-LDPCCs to further verify the effectiveness of embodiments of the present invention and to illustrate the benefit of combining the advantages of spatial coupling and the TAMSA.

SC-LDPCC Parity-Check Matrix. Given an underlying LDPC-BC with a $\mu\times\nu$ parity-check matrix $H_{BC}$ and rate $$R_{BC} = 1 - \frac{\mu}{\nu},$$

a terminated SC-LDPCC with parity-check matrix $H_{SC}^{L}$ and syndrome former memory m can be formed by partitioning $H_{BC}$ into m component matrices $H_i$, i=0, 1, . . . , m, each of size $\mu\times\nu$, such that $$H_{BC} = \sum_{i=0}^{m} H_i,$$

and arranging them as $$H_{SC}^{L} = \begin{bmatrix} H_0 & & & \\ H_1 & H_0 & & \\ \vdots & H_1 & \ddots & \\ H_m & \vdots & \ddots & H_0 \\ & H_m & & H_1 \\ & & \ddots & \vdots \\ & & & H_m \end{bmatrix}_{\mu(L+m)\times\nu L} \quad \text{(Equation 9)}$$

where the coupling length L>m+1 denotes the number of block columns in $H_{SC}^L$ and the rate of the terminated SC-LDPCC represented by $H_{SC}^L$ is given by $$R_{SC}^L = \frac{\nu L - \mu(L+m)}{\nu L} = 1 - \frac{\mu}{\nu}\left(1 + \frac{m}{L}\right),$$

such that $$\lim_{L\to\infty} R_{SC}^L = 1 - \frac{\mu}{\nu} = R_{BC}.$$

Figure 8:
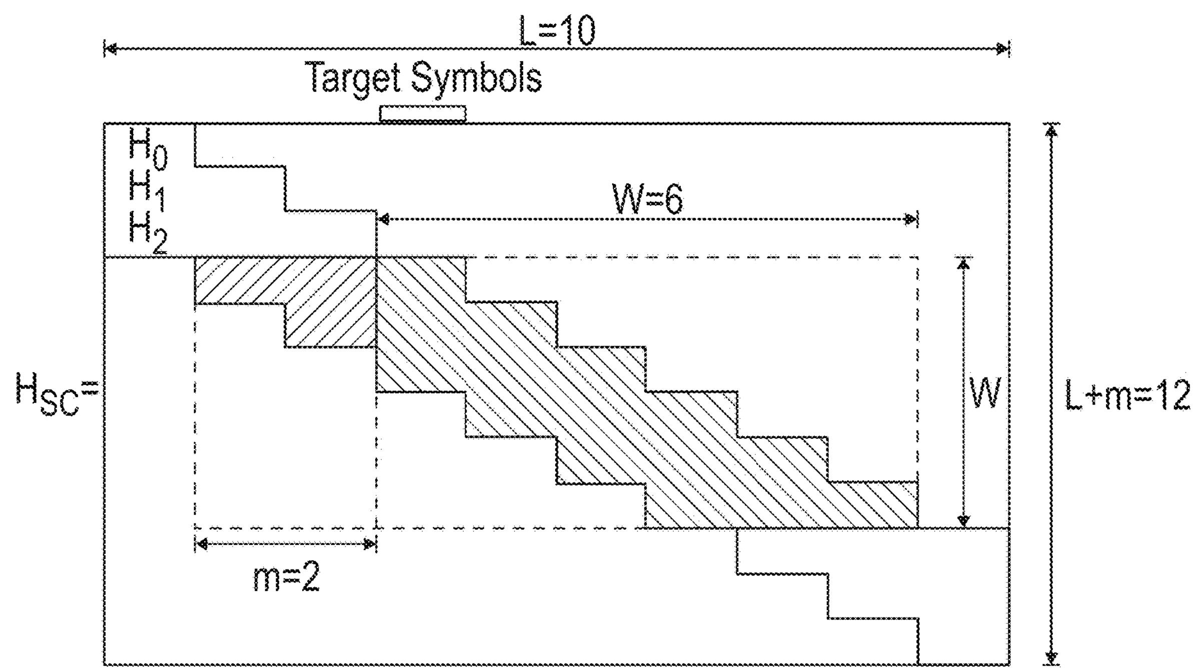
FIG. 8 is a graph which illustrates a sliding window ("SW") decoder for spatially coupled LDPC codes ("SC-LDPCC") operating on the parity-check matrix $H_{SC}$.

Sliding Window Decoding of SC-LDPCCs. A sliding window (SW) decoder can be used to address the large latency and complexity requirements of decoding SC-LDPCCs with a standard flooding schedule decoder. FIG. 8, illustrates an SW decoder with window size W=6 (blocks) operating on the parity-check matrix $H_{SC}^L$ of an SC-LDPCC with m=2 and L=10. All the variable nodes and check nodes included in the window (the cross-hatched area in the W=6 area) are updated using an MP algorithm that has access to previously decoded symbols (the cross-hatched area in the m=2 area). The goal is to decode the variable nodes in the first block of the window, called the target symbols. The MP algorithm updates the nodes in the window until some maximum number, which can be a predetermined number, of iterations $I_{max}$ is reached, after which the first block of target symbols is decoded. Then the window slides one block (ν code symbols) to the right and one block down (p parity-check symbols) to decode the second block, and the process continues until the last block of target symbols is decoded.

Figure 9:
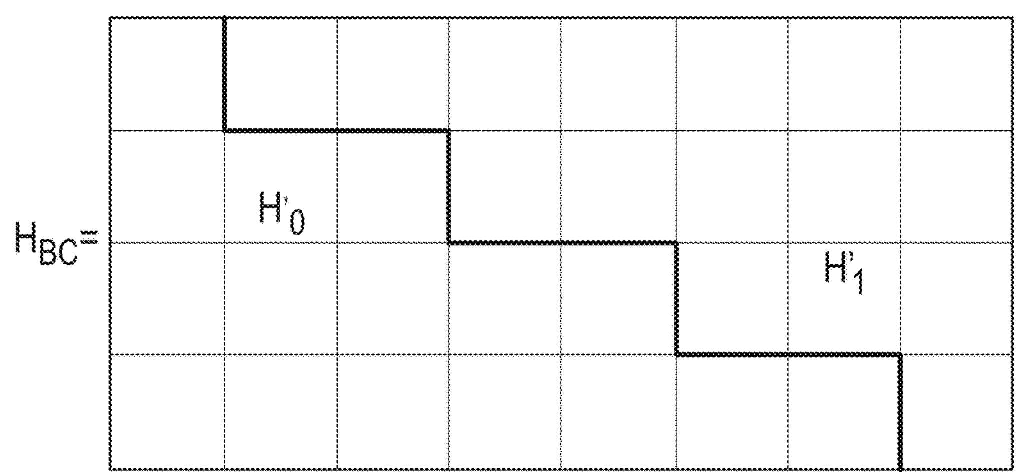
FIG. 9 is a graph which illustrates an LDPC block code ("LDPC-BC") LDPC-BC with 4000×8000 parity-check matrix $H_{BC}$, $\mu'$=4, $\nu'$=8, and $\gamma$=1000, which is partitioned by a cutting vector w=[1, 3, 5, 7] to construct the two component matrices $H_0$ and $H_1$ based on $H_0'$ and $H_1'$, wherein each square represents a $\gamma \times \gamma$ matrix.

Cut-and-Paste Construction of SC-LDPCC. For the case m=1, the cut-and-paste method of constructing SC-LDPCC uses a cutting vector $w=[w_0, w_1, \ldots, w_{\mu'-1}]$ of non-decreasing, non-negative integers $(0<w_0\le w_1\le \ldots \le w_{\mu'-1}<v')$ to form two component matrices $H_0$ and $H_1$ from a μ×ν LDPC-BC parity-check matrix $H_{BC}$. The cutting vector partitions $H_{BC}$, composed of a μ'×v' array of γ×γ blocks such that μ×ν=μ'γ×ν'γ are formed into two parts, one below and one above the cut, which can be represented by $H_0$ and $H_1$, respectively. FIG. 9 illustrates an example of a matrix $H_{BC}$ of size 4000×8000, where μ'=4, ν'=8, and γ=1000, are partitioned into $H_0'$ and $H_1'$ by the cutting vector w=[1, 3, 5, 7]. $H_0$ and $H_1$ in equation 9 are then obtained by taking $H_0$ and setting the $H_1'$ part to all zeros and by taking $H_1$ and setting the $H_0$ part to all zeros, respectively, where $H_0+H_1=H_{BC}$. The resulting code rate is given by $$R_{SC}^L = 1 - \frac{(L+1)\mu}{L\nu} = 1 - \frac{\mu}{\nu}\left(1 + \frac{1}{L}\right),$$

where the underlying LDPC-BC has rate $$R_{BC} = 1 - \frac{\mu}{\nu}.$$

For quasi-cyclic LDPC-BCs, such as array codes and Tanner codes, the parameter γ is set equal to the size of the circulant permutation matrices in order to maintain the code structure.

Simulation Results. The simulation results for the SC-LDPCC versions of the (8000,4000) LDPC-BC and the quasi-cyclic (155,64) Tanner code decoded with the TAMSA and an SW decoder with W=6, where 50 iterations were performed at each window position are presented in FIGS. 10 and 11. The SC-LDPCCs both have coupling length L=50 and syndrome former memory m=1. For the (8000,4000) code, γ=1000 and the cutting vector w=[1, 3, 5, 7] (as illustrated in FIG. 9) is chosen, and for the (155,64) Tanner code, γ=31 and w=[2,3,5] is chosen, where the size of the circulant permutation matrices is 31.

Figure 10:
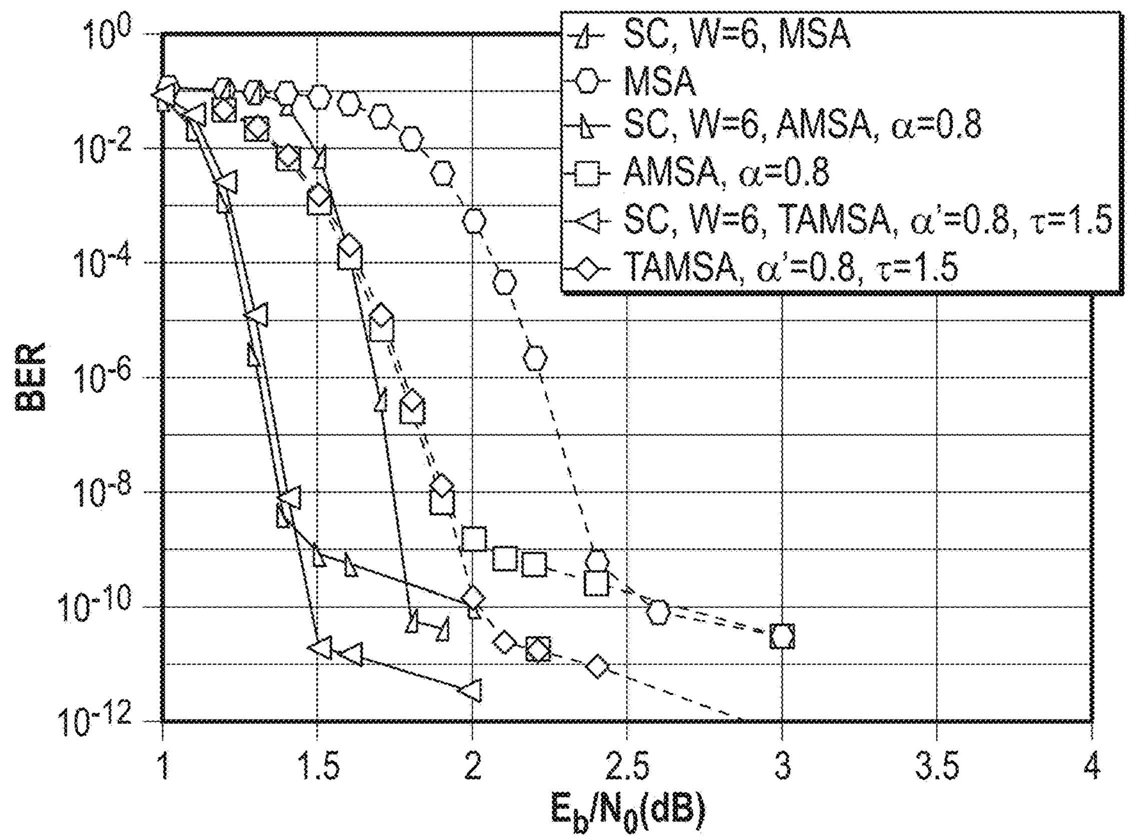
FIG. 10 is a graph which illustrates the performance of an (8000,4000) LDPC-BC and its spatially coupled version decoded with the MSA, AMSA, and TAMSA, wherein dashed curves represent the LDPC-BC and solid curves represent the SC-LDPCC decoded with a SW decoder with W=6.

FIG. 10 illustrates the BER performance of the (8000, 4000) LDPC-BC and its spatially coupled version decoded with an SW decoder with W=6 for the MSA, the AMSA with α=0.8, and the TAMSA with parameter set (α'=0.8, τ=1.5). We see that, for the chosen parameters, the TAMSA again has nearly two orders of magnitude better error floor performance than the MSA and the AMSA, for both the LDPC-BC and the SC-LDPCC, and it maintains the same waterfall performance. In addition, the spatial coupling yields a waterfall gain of about 0.5 dB for all the decoding algorithms compared to the underlying LDPC-BC. Moreover, the dominant problematic object for both the LDPC-BC and the SC-LDPCC decoded with the algorithms and parameters in FIG. 10 is the (5,3) absorbing set of FIG. 1. The multiplicity of this object is N=14 and $\hat{N}$=4.92 for the LDPC-BC and SC-LDPCC, respectively, where $\hat{N}$ is the average multiplicity per block of size ν=8000. Therefore, spatial coupling reduces the number of dominant problematic objects by 64%. This explains the almost one order of magnitude gain in the error floor obtained by spatial coupling compared to the underlying LDPC-BC.

Figure 11:
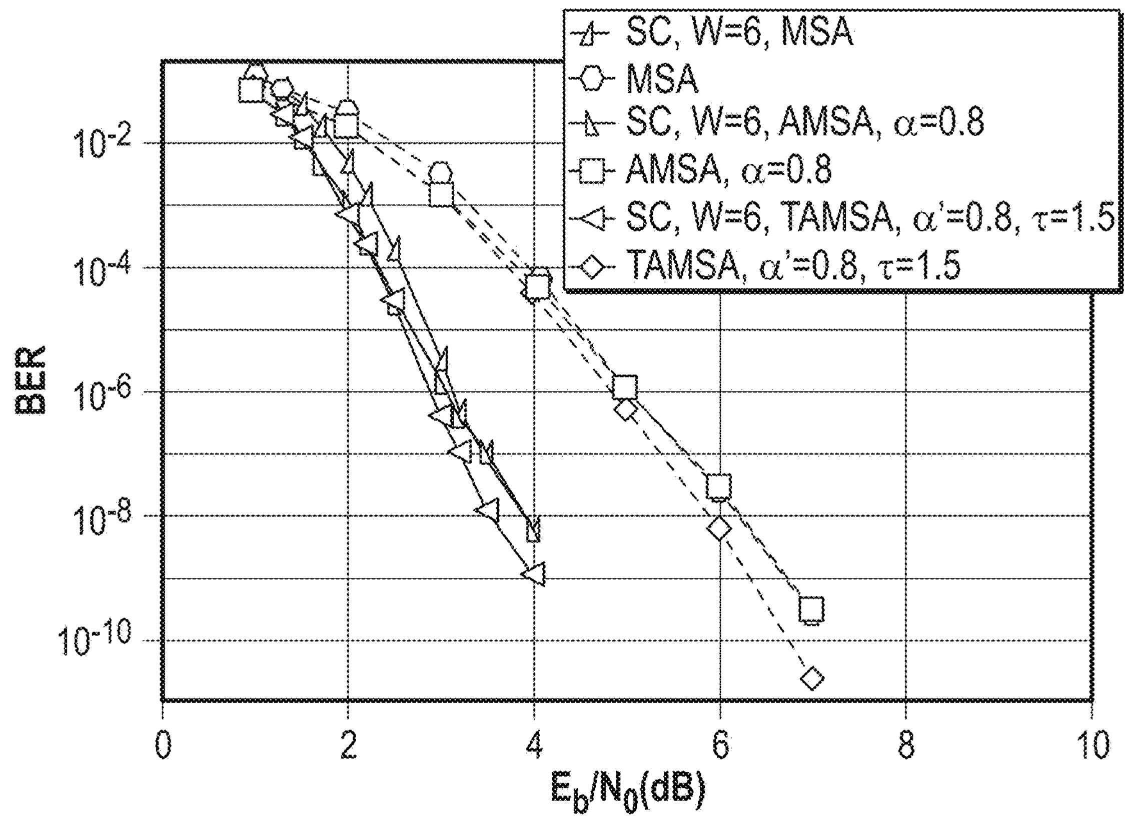
FIG. 11 is a graph which illustrates the simulated performance of the quasi-cyclic (155,64) Tanner LDPC-BC and its spatially coupled version decoded with an SW decoder with W=6 and the MSA, AMSA, and TAMSA.

FIG. 11 illustrates the BER performance of the quasi-cyclic (155,64) Tanner code and its spatially coupled version decoded with an SW decoder with W=6 for the MSA, the AMSA with α=0.8, and the TAMSA with parameter set (α'=0.8, τ=1.5). Again, the TAMSA outperforms the AMSA and the MSA at high SNRs by about one order of magnitude in the error floor, for both the LDPC-BC and the SC-LDPCC. In addition, an approximately 2 dB gain for the SC-LDPCC is provided as compared to its underlying LDPC-BC in the waterfall. The dominant problematic object for the (155,64) Tanner LDPC-BC decoded with the algorithms and parameters in FIG. 11 is an (8,2) absorbing set. The multiplicity of this object is about N=465, but in this case $\hat{N}$=0 for the SC-LDPCC (i.e., this object is completely removed by spatial coupling). As a result, there is almost five orders of magnitude gain at $E_b/N_0>3$ dB for the SC-LDPCC as compared to the underlying LDPC-BC.

The preceding examples can be repeated with similar success by substituting the generically or specifically described components and/or operating conditions of embodiments of the present invention for those used in the preceding examples.

Optionally, embodiments of the present invention can include a general or specific purpose computer or distributed system programmed with computer software implementing the steps described above, which computer software may be in any appropriate computer language, including but not limited to C++, FORTRAN, BASIC, Java, Python, Linux, assembly language, microcode, distributed programming languages, etc. The apparatus may also include a plurality of such computers/distributed systems (e.g., connected over the Internet and/or one or more intranets) in a variety of hardware implementations. For example, data processing can be performed by an appropriately programmed microprocessor, computing cloud, Application Specific Integrated Circuit (ASIC), Field Programmable Gate Array (FPGA), or the like, in conjunction with appropriate memory, network, and bus elements. One or more processors and/or microcontrollers can operate via the instructions of the computer code and the software is preferably stored on one or more tangible non-transitive memory-storage devices.

Note that in the specification and claims, "about" or "approximately" means within twenty percent (20%) of the numerical amount cited. All computer software disclosed herein can be embodied on any non-transitory computer-readable medium (including combinations of mediums), including without limitation CD-ROMs, DVD-ROMs, hard drives (local or network storage devices), USB keys, other removable drives, ROMs, and firmware.

Embodiments of the present invention can include every combination of features that are disclosed herein independently from each other. Although the invention has been described in detail with particular reference to the disclosed embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference. Unless specifically stated as being "essential" above, none of the various components or the interrelationship thereof are essential to the operation of the invention. Rather, desirable results can be achieved by substituting various components and/or reconfiguring their relationships with one another.

What is claimed is:

1. A method for lowering an error floor of a low-density parity-check ("LDPC") decoder chip, thereby improving bit-error-rate and/or frame-error-rate performance of the LDPC decoder chip, the method comprising:

for each message passed from a check node to a variable node, computing a check node log-likelihood ratio within a check node processing unit of the LDPC decoder chip by iteratively passing quantized messages between processing units on a decoder chip, wherein a plurality of check nodes are connected to a respective variable node and wherein a plurality of variable nodes are connected to a respective check node, and wherein the connections are specified by a parity-check matrix of LDPC code, wherein computing further comprises:

comparing a minimum value of a set of variable node log-likelihood ratio magnitudes that are input into the check node processing unit with a threshold, wherein each of the input variable node log-likelihood ratio magnitudes are one of a plurality connected to a respective check node;

based on the results of the comparison, determining at the check node processing unit whether to apply a reduction to a check node log-likelihood ratio magnitude or not to apply a reduction to the check node log-likelihood ratio magnitude;

applying a reduction to the check node log-likelihood ratio magnitude in instances when the determining step determines that a reduction should be applied; and not applying a reduction to the check node log-likelihood ratio magnitude in instances when the determining step determines that a reduction should not be applied.

2. The method of claim 1 wherein applying a reduction to the check node log-likelihood ratio magnitude at the check node processing unit comprises applying attenuation.

3. The method of claim 2 wherein applying attenuation comprises multiplying the check node log-likelihood ratio magnitude by a value that is greater than 0 and less than 1.

4. The method of claim 3 wherein applying attenuation comprises multiplying the check node log-likelihood ratio magnitude by a value that is less than one and greater than or equal to 0.5.

5. The method of claim 2 wherein applying attenuation comprises applying attenuation to the check node log-likelihood ratio magnitude before the check node log-likelihood ratio magnitude is passed from a check node to a variable node.

6. The method of claim 1 wherein applying a reduction to the check node log-likelihood ratio magnitude at the check node processing unit comprises applying an offset.

7. The method of claim 6 wherein applying an offset comprises applying a subtraction function.

8. The method of claim 7 wherein applying a subtraction function comprises subtraction of a predetermined number that is greater than zero.

9. The method of claim 7 wherein applying a subtraction function comprises subtracting a value greater than zero before passing the check node log-likelihood ratio to a connected variable node.

10. The method of claim 1 wherein comparing a minimum value of a set of connected variable node log-likelihood ratio magnitudes that are input into the check node processing unit with a threshold comprises determining whether the minimum value is less than the threshold.

11. The method of claim 1 wherein comparing a minimum value of a set of connected variable node log-likelihood ratio magnitudes that are input into the check node processing unit with a threshold comprises determining whether the minimum value is less than or equal to the threshold.

12. The method of claim 1 wherein comparing a minimum value of a set of connected variable node log-likelihood ratio magnitudes that are input into the check node processing unit with a threshold comprises comparing the minimum value with a predetermined value.

13. The method of claim 12 wherein the predetermined value comprises a value having a magnitude greater than 0.

14. The method of claim 1 wherein comparing a minimum value of a set of connected variable node log-likelihood ratio magnitudes that are input into the check node processing unit with a threshold further comprises comparing a second minimum value of the set of connected variable node log-likelihood ratio magnitudes that are input into the check node processing unit with a threshold.

15. The method of claim 1 wherein applying a reduction to the check node log-likelihood ratio magnitude comprises applying a multiplication function of greater than zero and less than one and applying a subtraction function to the check node log-likelihood ratio magnitude.

16. The method of claim 1 wherein applying a reduction to the check node log-likelihood ratio magnitude further comprises varying an amount of the reduction for each iteration.

17. The method of claim 1 wherein applying a reduction to the check node log-likelihood ratio magnitude further comprises varying an amount of the reduction based on a location of the check node log-likelihood ratio in a graph.

* * * * *